(12) United States Patent
Jiang et al.

(10) Patent No.: US 6,367,685 B1
(45) Date of Patent: *Apr. 9, 2002

(54) ULTRASONIC VIBRATION MODE FOR WIRE BONDING

(76) Inventors: Tongbi Jiang, 12036 W. Patrina Dr., Boise, ID (US) 83713; Zhiqiang Wu, 4012 Mildenhall Dr., Plano, TX (US) 75093

( * ) Notice: Subject to any disclaimer, the term of this patent is extended or adjusted under 35 U.S.C. 154(b) by 0 days.

This patent is subject to a terminal disclaimer.

(21) Appl. No.: 09/819,030

(22) Filed: Nov. 15, 2000

Related U.S. Application Data

(63) Continuation of application No. 09/293,676, filed on Apr. 16, 1999, now Pat. No. 6,244,498.

(51) Int. Cl.[7] .................................................. B23K 1/06
(52) U.S. Cl. ....................................... 228/180.5; 228/1.1
(58) Field of Search ........................... 228/180.5, 110.1, 228/178, 179, 180.22, 1.1, 25, 28, 29; 156/73.2, 580.1, 580.2

(56) References Cited

U.S. PATENT DOCUMENTS

| | | | | |
|---|---|---|---|---|
| 5,207,370 A | * | 5/1993 | Mochida et al. | |
| 5,699,950 A | * | 12/1997 | Jang | |
| 5,816,476 A | * | 10/1998 | Buice et al. | |
| 5,894,983 A | * | 4/1999 | Beck et al. | |
| 5,931,372 A | * | 8/1999 | Miller | |
| 5,976,314 A | * | 11/1999 | Sans | |
| 5,996,877 A | * | 12/1999 | Koduri | |

* cited by examiner

*Primary Examiner*—Tom Dunn
*Assistant Examiner*—Jonathan Johnson
(74) *Attorney, Agent, or Firm*—Winstead Sechrest & Minick P.C.; Hugh R. Kress

(57) ABSTRACT

A method and apparatus for creating second order vibrational modes. The apparatus includes a signal generator, a piezoelectric transducer, a plurality of wave propagating beams and reflecting boards. An electric field applied by the signal generator to the piezoelectric transducer induces a unidirectional vibration of the transducer. The vibration is propagated through the beams and reflected by the reflecting boards in a closed polygonal loop. The final reflection direction is perpendicular to the original vibration. A circular or elliptical vibration of the apparatus results. The circular or elliptical vibrational energy can be imparted to the wire bond of an integrated circuit to add strength to the connection.

14 Claims, 7 Drawing Sheets

ULTRASONIC VIBRATION MODE FOR WIRE BONDING

This is a continuation of application Ser. No. 09/293,676 filed Apr. 16, 1999 now U.S. Pat. No. 6,244,498.

BACKGROUND OF THE INVENTION

1. Field of the Invention

This invention relates generally to the field of semiconductor package wire bonding, and, more particularly, to a novel apparatus and method for producing an ultrasonic vibration mode to improve the bond between a wire and a die or lead.

2. Description of the Related Art

Wire bonding today is used throughout the microelectronics industry as a means of interconnecting chips, substrates, and output pins. Automatic ultrasonic gold ball bonding is a high yield interconnect process that uses heat and ultrasonic energy to form a metallurgical bond. Typically, high purity gold wire is used with a ball bond formed at one end and a stitch bond at the other. FIGS. 1a through 1g show the typical sequence of steps involved in forming a gold ball bond. FIG. 1a shows a capillary 10 which is targeted on the bond pad and positioned above a die 12 with a ball 14 formed on the distal end of a wire 16 and pressed against the face of capillary 10. Capillary 10 descends as shown in FIG. 1b, bringing ball 14 into contact with die 12. The inside radius of capillary 10 grips ball 14 in forming the bond. Ultrasonic vibration energy is then applied. The ultrasonic vibration energy is typically produced by piezoelectric transducers. Piezoelectric transducers are well known in the industry and comprise a piezoelectric material, i.e. a material that converts mechanical energy into electrical energy and vice versa. In the case of producing ultrasonic vibration energy, an electric field is applied to a piezoelectric ceramic to stimulate vibration. After ball 14 is bonded to die 12 with the aid of the ultrasonic vibration energy, capillary 10 raises to the loop height position as shown in FIG. 1c. A clamp 18 is then opened and wire 16 is free to feed out of the end of capillary 10. Next, a lead 20 of the device is positioned under capillary 10 and capillary 10 is lowered to the lead. Wire 16 is fed out the end of capillary 10, forming a loop as shown in FIG. 1d. The capillary continues downward and deforms wire 16 against lead 20, producing a wedge-shape bond which has a gradual transition into the wire as shown in FIG. 1e. Ultrasonic vibration energy is once again applied to enhance the bond strength. Capillary 10 then raises off lead 20 as shown in FIG. 1f, leaving a stitch bond. At a pre-set height, clamp 18 is closed while capillary 10 is still rising with the bonding lead. This prevents wire 16 from feeding out capillary 10 and produces an upward force on the bond. The force builds until wire 16 breaks, which it does at the smallest cross section of the bond. Finally, a new ball 14 is formed on the new distal end of wire 16 by employing a hydrogen flame or an electronic spark as shown in FIG. 1g. The process can then be repeated.

Ultrasonic aluminum wire bonding is also a widely used high speed, high throughput interconnect process. In this process, stitch bonds such as described above with reference to FIG. 1f are formed at both ends of the interconnect by a combination of pressure and ultrasonic energy. As the wire softens, freshly exposed metal in the wire comes in contact with the freshly exposed metal on the pad and a metallurgical bond is formed. Aluminum wire is typically doped with silicon (e.g., 1%) to more closely match the hardness of the wire with the bond pad material. Both gold and aluminum wire are used extensively today in packaging, with gold ball to aluminum bond pads being the most common interconnect system.

In conventional wire bonding processes, it is well known by those in the art that bonding strength is enhanced by employing ultrasonic vibration and heat during the bonding procedure and this is typically done. The strength of the bond is only enhanced, however, in the same direction as the ultrasonic vibration being applied. Current processes typically apply only unidirectional vibrations during wire bonding, whereas it would be desirable to enhance the bond strength in all directions. In addition, in order to ensure that integrated circuits are not degraded during the attachment of the bonding wires, it is desirable to conduct the ultrasonic wire bonding at relatively low temperatures. However, the lower the temperature, the more difficult it may be to form a sufficient bond. Therefore there is a continuing need to create better bonds at lower temperatures and at faster rates to increase productivity.

It has been proposed that the application of ultrasonic waves that are circular or elliptical can enhance the bond strength at lower temperatures and with a shorter dwell time, in each of the vibration directions. See e.g., Tsujino, "Ultrasonic wire bonding using high frequency 330, 600 kHz and complex vibration 190 kHz welding systems" (Ultrasonics 34 (1996) 223–228). This strengthening phenomenon has purportedly been achieved by producing the circular or elliptical vibration modes using multiple piezoelectric transducers. It is particularly desirable to generate a circular or elliptical vibration mode for better bond strength in all directions. However, current known methods for producing complex ultrasonic waves using multiple transducers typically employ separate, non-synchronous controls for each transducer, such that error or other difficulties may be introduced by the two separate controls that do not work together and result in a less than ideal higher order wave. In addition, a single transducer with a single control apparatus would be less expensive than two transducers with separate controls. There is a need for production of circular or elliptical ultrasonic vibrations with a mechanism that ensures that the two perpendicular modes needed for circular or elliptical modes are always vibrating synchronously.

SUMMARY OF INVENTION

In accordance with one aspect of the present invention, a novel ultrasonic vibration mode for wire bonding is provided. A second vibration direction is added to the conventional ultrasonic apparatus. The combined elliptical or circular vibration enhances wire bond strength in all directions and decreases bonding time and temperature. The second vibration direction is created with a single piezoelectric transducer and control mechanism in combination with a reflecting arm apparatus. The present invention enables two perpendicular wave modes to always vibrate synchronously. The invention can advantageously be applied to any ultrasonic bonding process to improve yield strength and reliability.

BRIEF DESCRIPTION OF THE DRAWINGS

The foregoing and other features and aspects of the invention will become further apparent upon reading the following detailed description and upon reference to the drawings in which.

Figure 1A:
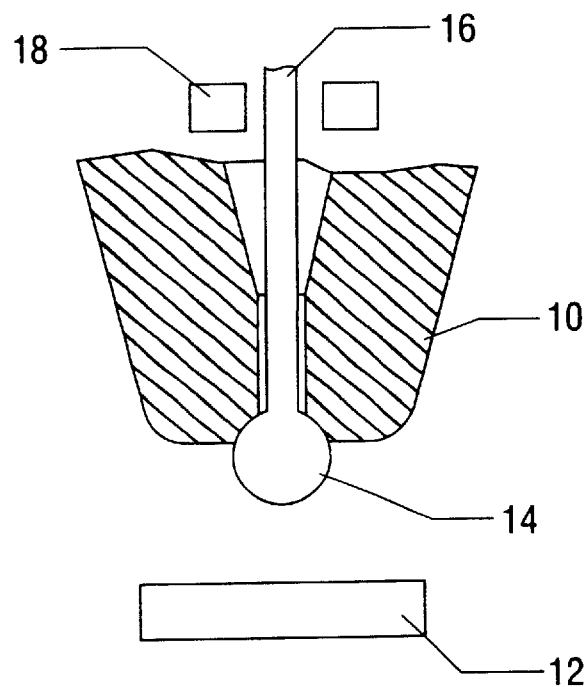
FIG. 1a illustrates a conventional wire bonding apparatus with a capillary targeted on the bond pad and positioned above a die with a ball formed on the end of a wire.
Figure 1B:
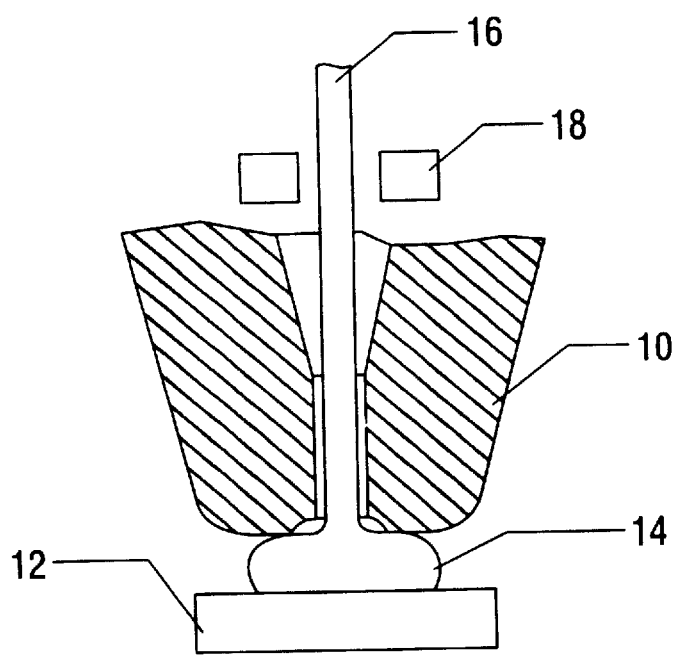
FIG. 1b illustrates the conventional wire bonding apparatus from FIG. 1a after the capillary has descended, bringing the ball into contact with the die.
Figure 1C:
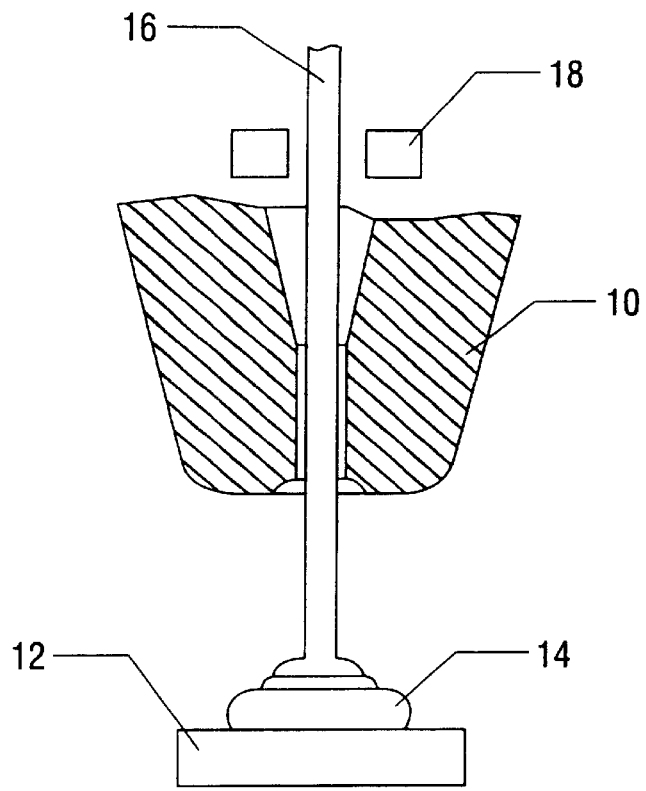
FIG. 1c illustrates the conventional wire bonding apparatus from FIG. 1a after rising to the loop height position.
Figure 1D:
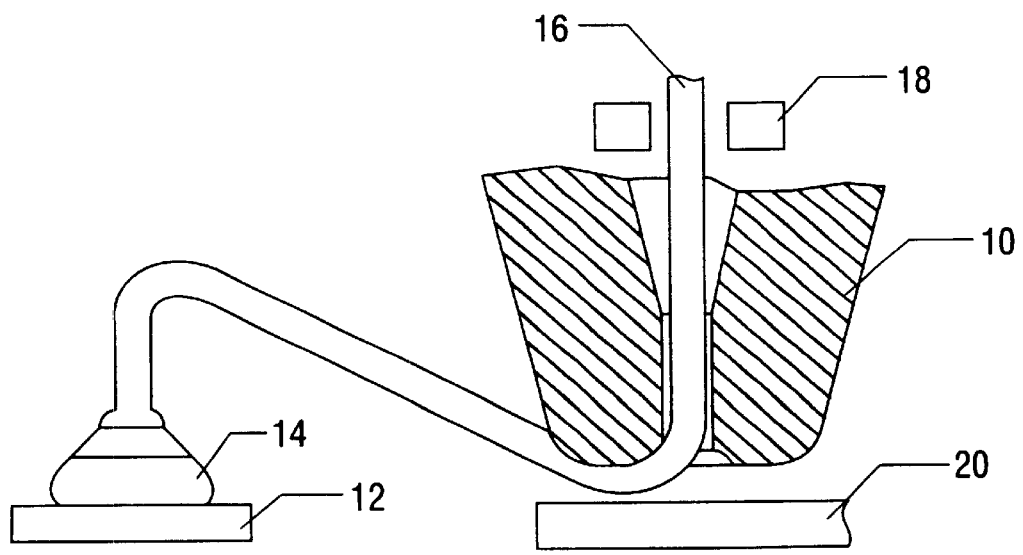
FIG. 1d illustrates the conventional wire bonding apparatus from FIG. 1a repositioned over the lead.
Figure 1E:
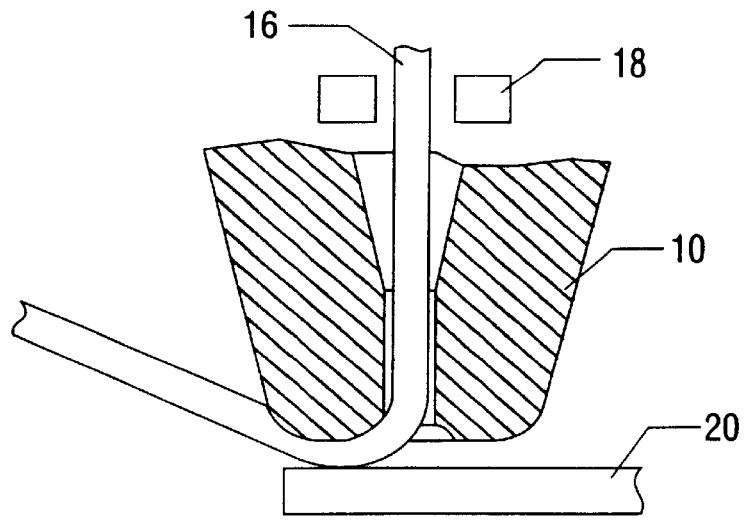
FIG. 1e illustrates the conventional wire bonding apparatus with the capillary deforming the wire against the lead.
Figure 1F:
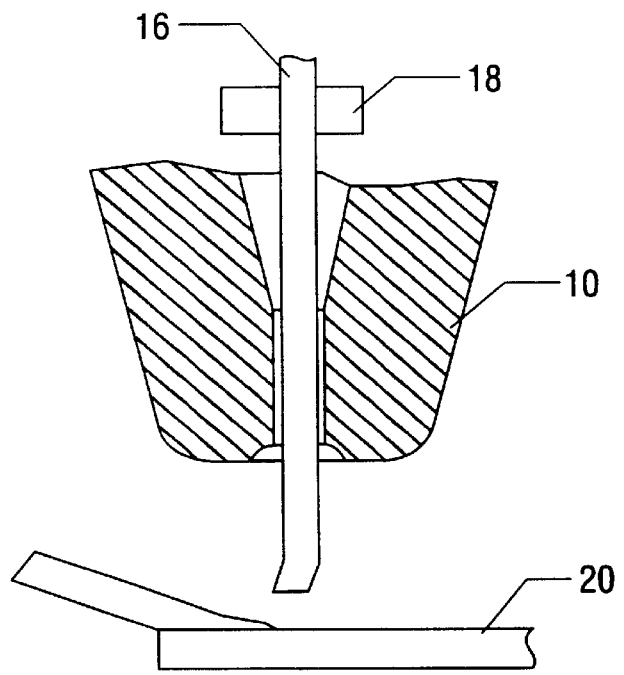
FIG. 1f illustrates the conventional wire bonding apparatus from FIG. 1a with the capillary raised off the lead and leaving a stitch bond.
Figure 1G:
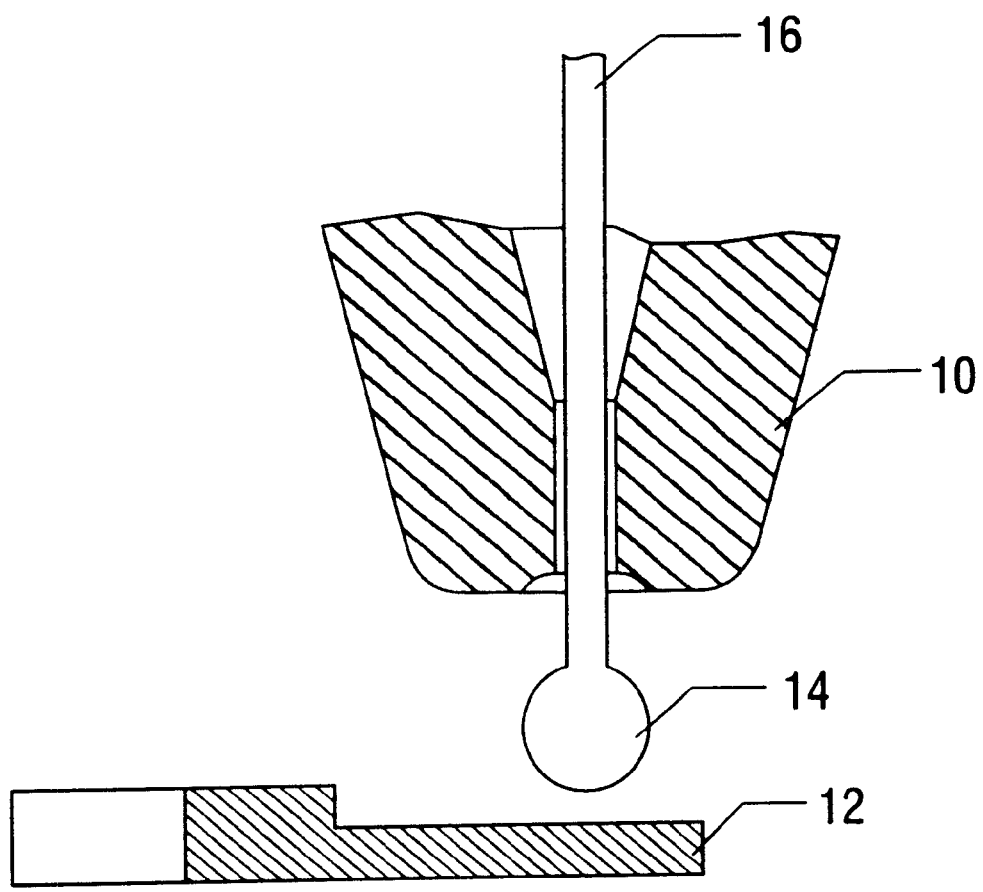
FIG. 1g illustrates the conventional wire bonding apparatus from FIG. 1a with a new ball formed on the tail of the wire.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, that will vary from one implementation to another. Moreover, it will be appreciated that such a development effort might be complex and time-consuming, but would nevertheless be a routine undertaking for those of ordinary skill in the art having the benefit of this disclosure.

Figure 2:
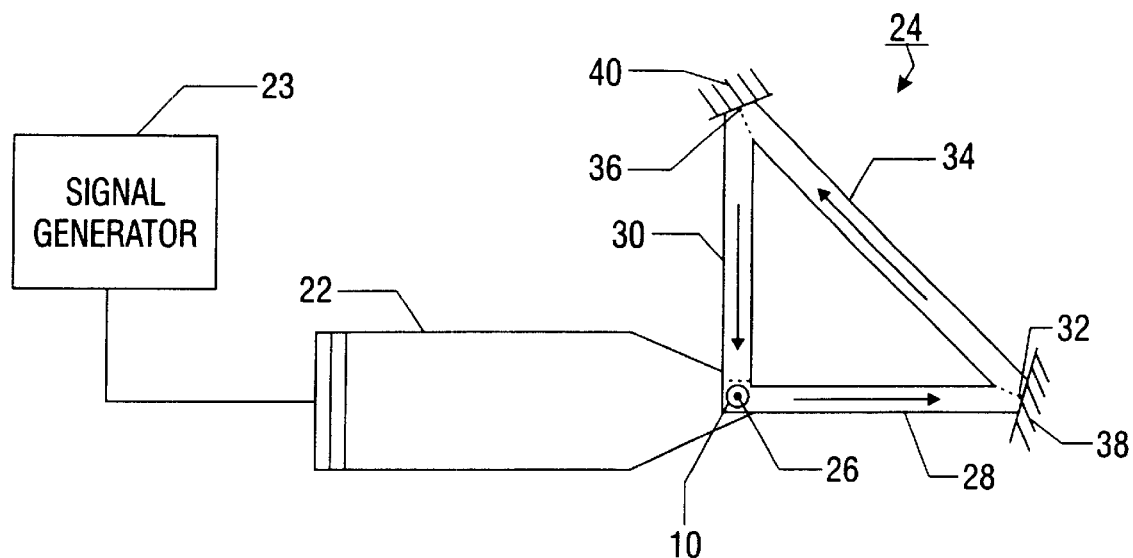
FIG. 2 is a top view of a piezoelectric transducer with a triangular shaped arm attached, in accordance with one embodiment of the invention.

Turning now to the drawings, and in particular to FIG. 2, one embodiment of the air invention is disclosed. In the embodiment of FIG. 2, a piezoelectric transducer 22 is mechanically attached to a polygonal arm 24. Polygonal arm 24, for example the substantially triangular-shaped arm 24 depicted in FIG. 2, comprises a medium through which the ultrasonic waves are capable of traveling when such waves are initiated by transducer 22. Arm 24 may comprise stainless steel or some other compatible material. Arm 24 includes multiple beams defined by closed connections, for example three beams 28, 30 and 34 and three connection points 26, 32 and 36. In an alternative embodiment shown in FIG. 6, arm 24 comprises a single beam formed into a polygonal shape. The individual lengths and number of beams may be arbitrary, but in accordance with the presently disclosed embodiment of the invention, the total length of the beams should yield:

$$\text{TotalLength} = (n \pm \tfrac{1}{4})\lambda$$

Where $\lambda$ is the ultrasonic wavelength in the beam media and n=0, 1, 2 . . .

In the embodiment of FIG. 2, point 26 joins beam 28 with beam 30, point 32 joins beam 28 with beam 34, and point 36 joins beam 34 with beam 30. At point 32 and 36, fixed reflection boards 38 and 40, respectively, attach to arm 24 by a weld or some other attaching mechanism. Reflection boards 38 and 40 will preferably comprise a material with an overall Young's Modulus that is substantially different from the beam material to promote optimum reflection of the wave from the original propagation direction. In theory, reflection boards 38 and 40 are fixed such that they act as infinite walls and reflect 100% of the wave energy. In practice, however, reflection boards 38 and 40 may be connected to the wire bonding apparatus and absorb a portion of the vibrational energy. In one embodiment, the fixed reflection boards 38 and 40 each reflect an ultrasonic wave 45° from the original wave propagation direction. In an alternative embodiment, multiple reflection boards attached to any number of beams each reflect and redirect an ultrasonic wave some angular amount. In the alternative embodiment shown in FIG. 6, a single piece arm 24 is only fixed to transducer 22, with no reflection boards. In the alternative embodiment of FIG. 6, the vibrational energy is propagated along the path of a single beam. In one embodiment the ultrasonic wave is preferably reflected or re-directed approximately 90° or some odd multiple of 90°.

Figure 3:
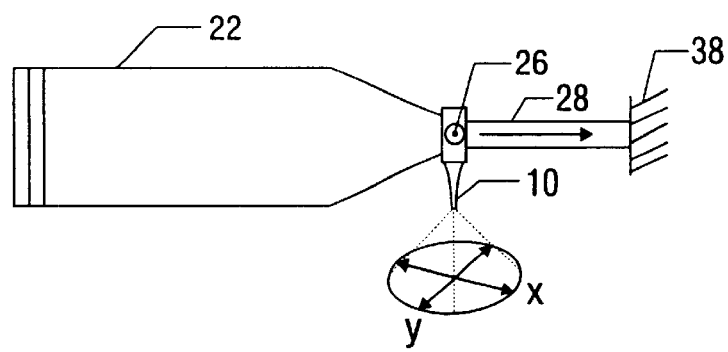
FIG. 3 is a side view of the piezoelectric transducer and attached arm, from FIG. 2.

Point 26 also describes the location of capillary 10, which is normal to the page in FIG. 2. Capillary 10 can be clearly seen in FIG. 3 extending down from point 26. As discussed above, capillary 10 houses wire 16. In the embodiment shown in FIG. 3, capillary 10 is orthogonal to the plane described by polygonal arm 24. FIG. 3 illustrates piezoelectric transducer 22 and arm 24 from a side view with beam 28 of arm 24 extending longitudinally from the end of piezoelectric transducer 22. Beam 28 terminates at fixed reflection board 38. FIG. 3 also shows an orthogonal view of the circular trajectory 42 that point 26 and capillary 10 follow as vibration in perpendicular directions along x and y axes 29 and 31 occurs.

Figure 4:
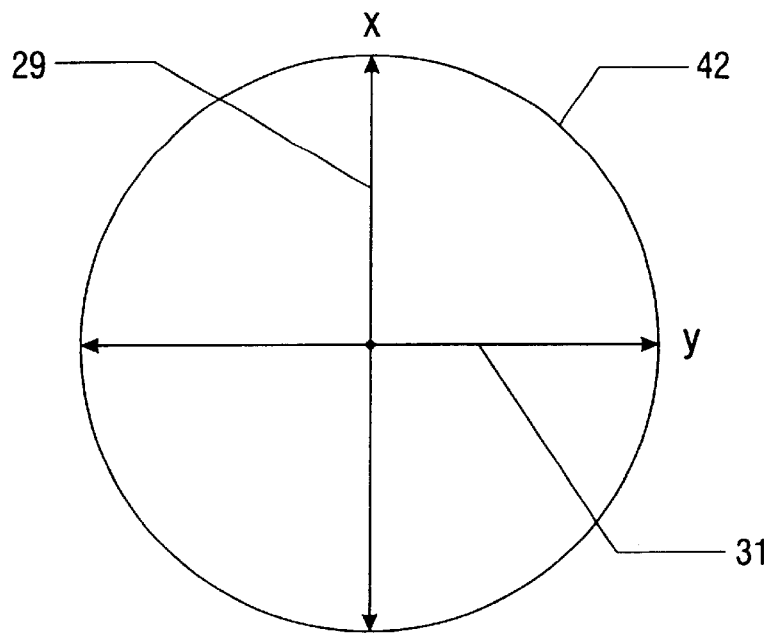
FIG. 4 illustrates a circular wave mode produced by the transducer/arm apparatus from FIG. 2.
Figure 5:
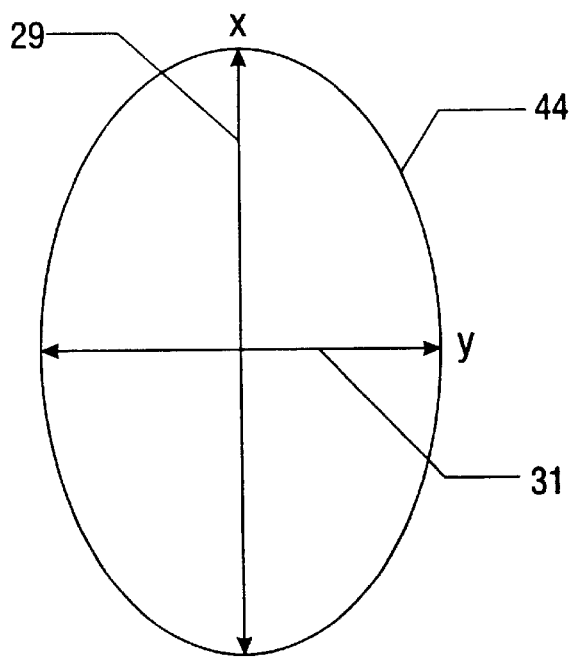
FIG. 5 illustrates an elliptical wave mode produced by the transducer/arm apparatus from FIG. 2.

Piezoelectric transducer 22 produces ultrasonic waves in response to an electrical field applied to the transducer by a signal generator 23. Signal generator 23, for example the standard signal generator that is included with a K & S 8000 Series wire bonding machine, can apply drive signals to the transducer. However, a single transducer can only produce unidirectional vibration waves, i.e. vibration in one planar direction, without the aid of arm 24. Operation of the device to produce a circular or elliptical ultrasonic vibration mode, i.e. vibration in two perpendicular planes, is as follows: An electric field is applied to transducer 22, which induces a unidirectional, longitudinal vibration of the piezoelectric material. Those of ordinary skill in the art will appreciate that the vibration is an ultrasonic wave that corresponds in frequency and amplitude to the electric field it is subjected to. The most common frequency is 60 kHz, but higher frequencies such as 120 kHz are becoming more common. The unidirectional, longitudinal vibration is communicated from the end of transducer 22 at point 26 to arm 24. Point 26 is thus vibrating at a certain frequency and amplitude longitudinally along beam 28 according to the vibration direction produced by the transducer. The axis defined by beam 28 is referred to herein as the x-axis 29. The wave travels through beam 28 of arm 24 until it reaches fixed reflection board 38. The wave is reflected 45° at reflection board 38 and continues along beam 34 until it reaches reflection board 40, where it is reflected another 45°. The wave continues along beam 30 of arm 24 where it meets perpendicularly with the wave being generated by transducer 22 at point 26. The axis defined by beam 30 is referred to herein as the y-axis 31. At point 26 there is now a circular or elliptical wave mode produced with the characteristics exhibited in FIGS. 4 and 5. The circular and elliptical paths shown in FIGS. 4 and 5 represent the trajectories 42 and 44 of point 26 and capillary 10. Point 26 and thus capillary 10 are vibrating in two perpendicular directions (the x and y directions) to produce the circular mode. In theory, the reflectors reflect 100% of the vibrational energy and the resultant vibration mode at point 26 is perfectly circular as shown in FIG. 4. In reality, there may some energy lost to absorption by the reflectors and the resulting vibration mode may be elliptical as shown in FIG. 5. In the alternative embodiment shown in FIG. 6, arm 24 comprises a single beam formed into a polygonal shape with no reflecting boards. In this alternative embodiment the wave vibration is re-directed approximately 90° along the beam path until it meets perpendicularly with the wave generated by transducer 22 at point 26 to create a circular or elliptical wave mode.

Those of ordinary skill in the art will appreciate that a circular or elliptical mode of all ultrasonic energy such as is provided by systems in accordance with the presently disclosed embodiment of the invention allows a wire being bonded to attach more securely in a shorter amount of time and/or at a lower temperature than conventional wire bonding. One potential advantage of a lower bonding temperature is the avoidance of copper leadframe oxidation. Another potential advantage of a lower temperature is the fact that at high temperatures, polymeric die adhesive absorbs ultrasonic energy, and it is desirable minimize this absorption so that more ultrasonic energy is absorbed by the bond, thus increasing bond strength. One reason the circular or elliptical mode allows wire bonding to be done in a shorter time is that, as noted above, bond strength is only increased in the direction of the ultrasonic vibration. If the vibration is unidirectional, the bond is only strengthened in one direction; hence, ultrasonic energy must be applied long enough to ensure the added bond strength in the one direction is sufficient to compensate for the relatively weaker bond strengths in other directions. With the circular or elliptical vibrational mode created by systems in accordance with the presently disclosed embodiment of the invention, the bond is strengthened in all directions, allowing shortened dwell time and reduced bonding temperature.

FIG. 4 illustrates the theoretical vibration mode accomplished by systems in accordance with the presently disclosed embodiment of the invention. The circular mode is the general trajectory path 42 of point 26. Point 26 exhibits movement in all directions of the x-y plane, strengthening the bond equally in each of the planar directions. It is likely, however, that there will be some energy lost to reflection boards 38 and 40, or, in the alternative embodiment, to the single beam, and the resultant vibrational mode will be elliptical as shown in FIG. 5. The elliptical trajectory 44 of point 26 also encompasses all the x-y planar directions, however, the bond in x-direction 29 will be stronger than the bond strength in y-direction 31 if the vibrational mode resembles elliptical shape of FIG. 5. This result occurs because of the greater vibrational energy that is imparted in x-direction 29 than in y-direction 31 in the elliptical mode.

It will be understood that fixed arm 22 rigidly attached at a 90° angle to transducer 22 enables the vibration at point 26 to be a combination of perpendicular waves, creating a circular or elliptical vibration mode and eliminating the need for precise control of dual transducers to ensure the same result.

A method of creating the circular or elliptical ultrasonic vibration modes according to the present invention for use with wire bonding may include: a) attaching one or more of beams in a polygonal arm configuration, for example attaching beams 28, 34, and 38 in the substantially triangular configuration shown in FIG. 2; b) attaching the arm to a transducer, for example attaching arm 24 to transducer 22; c) reflecting vibrational energy generated by the transducer from one beam to the next with a reflecting board, for example reflecting the vibration in beam 28 to beam 34 via reflecting board 32; and d) arranging the beams such that the angle between the two beams at the attachment point of the arm to the transducer is 90° or some odd multiple thereof, for example the 90° angle between beam 28 and beam 38 at attachment point 26. The ultrasonic vibrational energy generated is imparted to the bonding site of a wire bonding apparatus.

Figure 6:
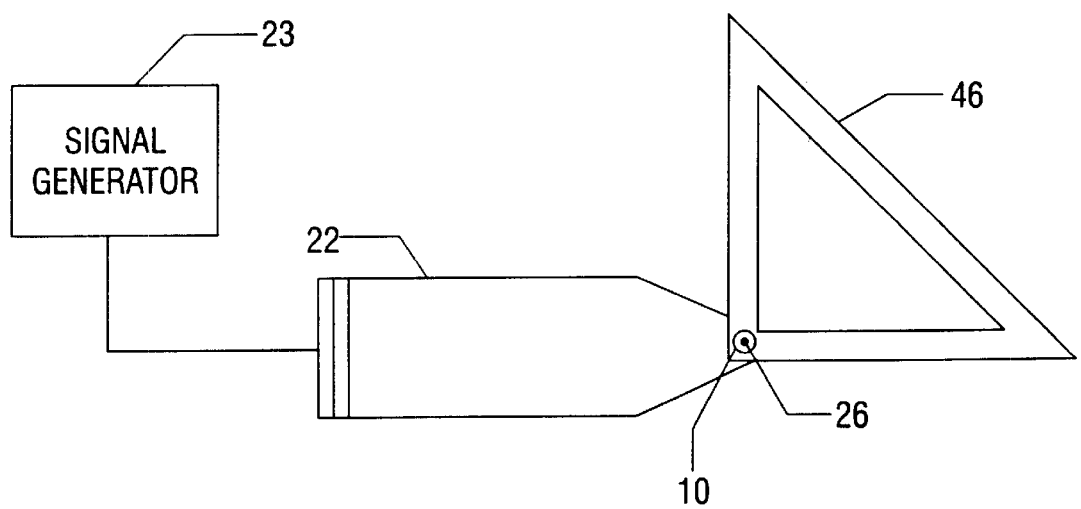
FIG. 6 is a top view of an alternative embodiment of the piezoelectric transducer and attached arm.

A method for creating circular or elliptical ultrasonic vibration modes in an alternative embodiment may include: a) attaching a single beam in a closed arm configuration to a transducer, for example triangular arm 46 attached to transducer 22 as shown in FIG. 6; b) redirecting a portion of the vibrational energy generated by the transducer along the closed path defined by the arm, for example redirecting a portion of the vibrational energy along the triangular path defined by arm 46; and c) arranging the single beam arm such that the angle between the two distal ends of beam at the arm/transducer attachment point is 90° or some odd multiple thereof, for example the 90° angle shown at point 26 of FIG. 6 between arm 46 and transducer 22.

A method for forming a bond between a wire and a conductive element at a bond site incorporating the present invention may include: a) generating ultrasonic energy, for example the ultrasonic energy generated by piezoelectric transducer 22; b) applying a first portion of the ultrasonic energy directly to the bond site in a first direction, for example applying the ultrasonic energy in x-direction 29 as shown in FIG. 3; c) redirecting a second portion of the ultrasonic energy along a medium capable of transmitting said ultrasonic energy, for example redirecting the vibrational energy along arm 24 as shown in FIG. 2; and d) applying the second portion of the ultrasonic energy to the bond site in a second direction different from the first direction, for example apply the ultrasonic energy in y-direction 31 as shown in FIG. 3.

While the present invention has been particularly shown and described with reference to a particular illustrative embodiment thereof, it will be understood by those skilled in the art that various changes in form and details may be made without departing from the spirit and scope of the invention. The above-described embodiment is intended to be merely illustrative, and should not be considered as limiting the scope of the present invention.

What is claimed is:

1. A wire bonding apparatus, comprising:
   a capillary having a lumen therein adapted to receive a bonding wire therein, said bonding wire having a ball formed on a distal end thereof extending at least partially out of said capillary;
   an ultrasonic transducer, coupled to said capillary and adapted to impart ultrasonic vibrational energy to said capillary;

wherein said ultrasonic transducer comprises:

a transducer for generating vibrational energy;

a signal generator for applying drive signals to said transducer;

a polygonal ultrasonic wave-propagating arm coupled to said transducer, said polygonal arm comprising a plurality of beams and at least one fixed reflection board, said beams and said at least one fixed reflection board cooperating to angularly reflect said vibrational energy such that said capillary vibrates in a substantially circular or elliptical vibration mode.

2. A wire bonding apparatus, comprising:

a capillary having a lumen therein adapted to receive a bonding wire therein, said bonding wire having a ball formed on a distal end thereof extending at least partially out of said capillary;

an ultrasonic transducer, coupled to said capillary and adapted to impart ultrasonic vibrational energy to said capillary;

wherein said ultrasonic transducer comprises:

a transducer for generating vibrational energy;

a signal generator for applying drive signals to said transducer;

an ultrasonic wave-propagating arm coupled to said transducer, said arm comprising a single beam configured in a closed loop to angularly redirect said vibrational energy such that said capillary vibrates in a substantially circular or elliptical vibration mode.

3. A wire bonding apparatus in accordance with claim 1 or 2, wherein said transducer comprises a piezoelectric ceramic.

4. A wire bonding apparatus in accordance with claim 1 or 2, wherein said capillary is adapted to target a bond pad on a silicon substrate.

5. A wire bonding apparatus in accordance with claim 1 or 2, wherein said arm has a substantially triangular shape.

6. A wire bonding apparatus in accordance with claim 1 or 2, wherein said arm is mechanically coupled to said transducer.

7. A wire bonding apparatus in accordance with claim 6, wherein said capillary is mechanically coupled to said arm.

8. A wire bonding apparatus in accordance with claim 7, wherein said capillary vibrates in a substantially circular mode.

9. A wire bonding apparatus in accordance with claim 7, wherein said capillary vibrates in a substantially elliptical mode.

10. A wire bonding apparatus in accordance with claim 1, wherein the collective length of said beams comprising said polygonal arm is governed by:

$$\text{TotalLength} = (n \pm \tfrac{1}{4})\lambda$$

where $\lambda$ is the ultrasonic wavelength in the beam media and $n = 0, 1, 2, \ldots$ 11. A wire bonding apparatus in accordance with claim 1, wherein the total length of said beam is governed by:

$$\text{TotalLength} = (n \pm \tfrac{1}{4})\lambda$$

where $\lambda$ is the ultrasonic wavelength in the beam media and $n = 0, 1, 2, \ldots$ 12. A wire bonding apparatus in accordance with claim 1, wherein said at least one reflection board is rigidly coupled to at least one of said plurality of beams.

13. A wire bonding apparatus in accordance with claim 12, wherein said at least one reflection board is rigidly coupled to at least one of said plurality of beams at a connection point between two of said plurality of beams.

14. A wire bonding apparatus in accordance with claim 1, wherein said at least one reflection board comprises a material with an overall high Young's Modulus than the material comprising said plurality of beams.

* * * * *